US005798935A

United States Patent [19]
Doreswamy et al.

[11] Patent Number: 5,798,935
[45] Date of Patent: Aug. 25, 1998

[54] METHOD AND APPARATUS FOR SIZING BUFFERS TO PROVIDE MINIMAL SKEW

[75] Inventors: Manjunath Doreswamy; Aleksandar Pance, both of Sunnyvale; Yuan-Jung Lin, Santa Clara, all of Calif.

[73] Assignee: Sun Microsystems, Inc., Palo Alto, Calif.

[21] Appl. No.: 673,041

[22] Filed: Jul. 1, 1996

[51] Int. Cl.$^6$ ........................................... G06F 19/00
[52] U.S. Cl. .................. 364/488; 364/489; 364/490; 364/491; 364/578; 371/1; 395/500
[58] Field of Search ................ 371/1; 395/551, 395/552, 555, 556, 557, 558, 770, 607, 613, 500; 364/488–491

[56] References Cited

U.S. PATENT DOCUMENTS

| 5,208,764 | 5/1993 | Rusu et al. ........................ 364/491 |
| 5,309,035 | 5/1994 | Watson, Jr. et al. ................ 367/269 |
| 5,638,291 | 6/1997 | Li et al. .......................... 364/490 |

OTHER PUBLICATIONS

"Zero Skew Clock Routing With Minimum Winelength" Ting Hai Chao et al. 1992 IEEE, pp. 799–814.
"A Zero Skew Clock Routing Scheme for ULSI Circuits" Ying Meng Li et al., 1992 IEEE pp. 458–463.

Primary Examiner—Kevin J. Teska
Assistant Examiner—A. S. Roberts
Attorney, Agent, or Firm—Beyer & Weaver, LLP

[57] ABSTRACT

Disclosed is a system for automatically generating tables of buffer data which can be used during integrated circuit design to select appropriate buffers for signal distribution networks. The generated buffer data may be used by automated place and route systems to generate signal distribution networks having minimal skew. In the table, incrementally varying network features or criteria are provided (in the form of a table or list for example). Examples of such features include the length of a line connecting an L4 buffer to one or more L5 buffers and the number of L5 buffers driven by a single L4 buffer. For each incremental value of the network feature or features, one or more buffer types is specified. These buffer types have been previously modeled in the environment of the incremental value of the network features and found to meet certain criteria necessary to minimize skew. If when designing a signal distribution network the designer (or design tool) chooses L4 buffers from the proper locations on the table, then skew should be minimized.

30 Claims, 10 Drawing Sheets

620

| # of L5 Buffers | Line Length 0-99 μm | Line Length 100-199 μm | Line Length 200-299 μm | Line Length 300-399 μm | ... | Line Length x-(x+99) μm |
|---|---|---|---|---|---|---|
| 1 | 1x | 1x | 1x, 2x | 1x, 2x | ... | 5x |
| 2 | 1x, 2x, 3x | 1x, 2x, 3x, 4x | 2x, 3x, 4x | 2x, 3x, 4x | ... | 4x, 5x |
| 3 | 2x, 3x, 4x | 3x, 4x, 5x | 3x, 4x, 5x | 3x, 4x, 5x | ... | 7x, 8x |
| 4 | 3x, 4x | 4x, 5x | 4x, 5x | 4x, 5x | ... | 8x, 9x |
| 5 | 4x, 5x | 5x, 6x | 5x, 6x | 5x, 6x | ... | 8x, 9x, 10x |
| ... | ... | ... | ... | ... | ... | ... |
| n | 15x, 16x | 15x, 16x | 16x | 16x | ... | 17x |

FIG. 6

METHOD AND APPARATUS FOR SIZING BUFFERS TO PROVIDE MINIMAL SKEW

CROSS REFERENCE TO RELATED APPLICATIONS

This application is related to U.S. patent application Ser. No. 08/673,115 filed on the same day as the instant application, entitled A METHOD OF GENERATING EXACT-LENGTH WIRES FOR ROUTING CRITICAL SIGNALS, and naming Manjunath Doreswamy, Aleksandar Pance, and David Lin as inventors. That application is incorporated herein by reference for all purposes.

BACKGROUND OF THE INVENTION

The present invention relates to methods and apparatuses used to design signal distribution networks in integrated circuits. More specifically, the invention relates to methods and apparatuses for sizing buffer circuits to control the skew associated with signals propagating through various levels of a signal distribution network.

Some signals such as clock signals must be propagated throughout an entire integrated circuit. To this end, integrated circuits are designed with signal distribution networks containing buffer circuits segregated into levels. For example, a distribution network may be configured in a tree-like arrangement, wherein the Level 1 (L1) buffer circuit receives signals directly from a source circuit, such as a clock. The signal distribution network branches from the L1 buffer circuit to multiple Level 2 (L2) buffer circuits. Next, each of these L2 buffer circuits, in turn, feeds the signals to multiple Level 3 (L3) buffer circuits, etc. Ultimately, the propagated signals reach the end of the signal distribution network and are applied to appropriate destination circuits, such as flip-flops.

FIG. 1 illustrates a representative signal distribution network 100 that may be used to control and distribute signals throughout a microprocessor or a similar integrated circuit. The signal distribution network 100 replicates and distributes signals from an initial source to a multiplicity of destinations. To function properly, signal distribution network 100 should be designed to carefully control the timing and quality of the replicated signals. For example, if the signal being replicated and distributed in a microprocessor circuit is a clock signal, the design of the circuitry should be such that the replicated clock signals arrive at their destination circuits at or about the same time and at or about the same magnitude.

The representative signal distribution network 100 shows five levels of buffer circuits, that is L1, L2, L3, L4, and L5, that are coupled together to form a signal distribution network. Note however that a signal distribution network is not limited to five levels of buffer circuits and may have any number of levels.

The first level includes an L1 buffer circuit 102 which replicates a signal received from another circuit, such as a clock and outputs an initial signal. The signal distribution network 100 is typically designed to input and output a binary direct current signal, through which the magnitude or polarity of the signal represents a logical high (H) and logical low(L) value. The circuitry within the signal distribution network 100 is preferably designed to quickly transition between these logical states, such that the rise times and fall times associated with the circuit's signaling transitions are reasonably quick and the steady-state output signals are sufficiently constant in magnitude.

The signal output from the L1 buffer circuit 102 is applied to the next level of the signal distribution network 100 which includes at least one L2 buffer circuit 104 (e.g., 104a and 104b). Each L2 buffer circuit replicates and further distributes the signal to at least one L3 buffer circuit 106 (e.g., 106a and 106b). In like manner, each L3 buffer circuit replicates and further distributes the signal to at least one L4 buffer circuit 108 (e.g., 108a and 108b). Each of the L4 buffer circuits again replicates and further distributes the signal to at least one L5 buffer circuit 110 (e.g., 110a and 110b). Each L5 buffer circuit replicates, distributes and applies the signal to the controlling input of at least one destination circuit, such as a flip-flop within a group of flip-flop circuits 112 (sometimes referred to as a "flop row").

As shown in FIG. 1, specific L4 buffer circuits, L5 buffer circuits and flip-flop circuits may be co-located within a control block 114, for example 114a or 114b, which may be dedicated to controlling the flow of signals and data within a data path or other circuit within the microprocessor. Additionally, the output signal from at least one L3 buffer circuit may be applied to other functional block circuits within the integrated circuit such as a data path block 116, and a mega-cell 118. The data path block 116 and mega-cell 118, typically include various data processing elements, such as accumulators, multiplexers, multipliers, etc. The flow of data through these various elements is controlled by an associated control block.

While buffer circuit designs may vary, typical buffer circuits include two invertors connected in series, wherein the first invertor receives an output signal from the previous level buffer circuit and outputs an opposite logical valued signal (e.g., a NOT gate). The output signal from the first invertor is then applied to the input of the second invertor which outputs the opposite logical valued signal (e.g., a NOT gate), thereby replicating the output signal from the previous level buffer circuit. In addition to providing for signal distribution, such a buffer circuit may also be designed to provide for signal buffering, signal amplification, signal filtering, and circuit isolation.

Buffer circuits are typically designed to adequately drive and control a multitude of next level buffer circuits. As such, buffer circuits may come in a variety of sizes, wherein each size corresponds to a loading or drive capability associated with the buffer circuit's output signal strength.

When designing integrated circuits, especially microprocessors, it is important to select buffer circuits that can supply an output signal capable of driving the next level buffer circuits while also adhering to the integrated circuit's timing, power, environments, for example, the integrated circuit designers may select appropriate heating, layout and other constraints. As a result, multiple L4 buffer circuit designs are typically made available to micro processor designers so that appropriate buffers can be placed at appropriate locations in the signal distribution network. One very important consideration in choosing appropriate buffer is signal "skew."

FIG. 2 is a sampled output signal graph 220 comparing an output signal from the L5a1 buffer circuit 110a with an output signal from the L5a2 buffer circuit 110b, wherein each signal is transitioning from a low to a high voltage state. As shown in the sampled output signal graph 220, the two signals transition at slightly different times. The difference in transition times, as measured from the time the transition is 50% completed, is the "skew". The skew shown in the sampled output signal graph 220 represents the time difference between the low to high transition in A and the low to high transition in B.

Thus, the skew shown in the sampled output signal graph 220 represents the skew of the signal distribution network 100 which may be a result of one or more signal propagation characteristics associated the circuit's design, components and materials, and any differences therein. Furthermore, the signal propagation characteristics and associated propagation delays and skew at any given network level result from several combined factors, such as the loads driven by the buffer circuits in the previous levels, the lengths and propagation characteristics of the lines connecting the buffer circuits, and the resistive and capacitive properties of the buffer circuit components. Additional factors include the signal's waveform, the circuit's shielding, and the circuits temperature which may also effect the propagation delays and subsequently the skew.

To further illustrate how skew is propagated and grows through a signal distribution network, FIG. 3 presents a more detailed time line for a transitioning signal to propagate through the signal distribution network 100. The vertical axis of FIG. 3 presents the voltage levels, "L" and "H", of the output signals from the various level buffer circuits depicted in FIG. 1. The horizontal axis represents a time scale. Note that neither axis, nor any signal, is necessarily drawn to scale.

As shown in FIG. 3, when the output of the L1 buffer circuit transitions from L to H at time R0, the L2 buffer circuits L2a and L2b replicate the signal transition at times R1 and R2, respectively. Note that the time measurements in FIG. 3 are taken when the signal's voltage transition is 50% complete, however such measurements could be taken at other transitioning moments.

The time delay between the time R1 and time R2 represents the skew for the signal distribution circuit as measured at the L2 stage. However, there are three additional buffer circuit levels(i.e., levels 3, 4 and 5) which will propagate the signal, and potentially expand or compress the skew. At the L3 stage, for example, skew is measured between the inputs to L3a1 and L3a2. Thus, the time difference between R3 and R4 represents the skew at the third stage. Likewise, the time difference between R5 and R6 represents the skew at the fourth stage. Note that skew is measured between the first and last signal transitions at a given stage. Applying this principle, it is seen that the skew at level 5 is measured between R7 and R9. R8, the transition time of the intermediate switching L5 buffer is not used to calculate skew.

Also shown in FIG. 3 is an output signal from the L1 buffer circuit, transitioning from a logical high to a logical low, beginning at time F0 and propagating through levels 2 through 5 by time F9. The transitioning times and related skews between times F0 and F9 will be similar to those described above. The skew, as measured at L5 would, therefore, be the delay between times F7 and F9. Note that for both transitions, the time line, shape and number of waveforms shown in FIG. 3 are purely for demonstrative purposes, and that typical integrated circuits will likely include sharper transitions.

When designing the signal distribution network 100, designers typically set an overall skew budget for the signal distribution network 100 and a skew budget for each buffer level. The skew budgets are typically selected to insure that the signals propagating through the signal distribution network 100, and within a given level, are timed as to not arrive too early or too late to properly control or effect the next level buffer circuits or the destination circuits. For example, if flip-flop circuits 112 are coupled to a circuit which latches the logical signal on a line, the timing for transitioning the flip-flop circuits 112 must correspond to the time when the signal sought to be latched is actually present on the line. For microprocessor designs, such as the UltraSPARC family of microprocessors produced by Sun Microsystems, Inc. of Mountain View, Calif., the overall skew budget for the control block's clock buffer circuitry is on the order of hundreds of picoseconds, with each level of circuitry having an even lower skew budget.

In addition to analyzing the skew, a rise time and a fall time associated with the output signal from a buffer circuit may also be of importance when designing a signal distribution network 100. Typically, the rise time is the time required for the voltage of the output signal to transition from 20% to 80% of the signal transition from a logical low to a logical high. Similarly, the fall time is typically the time required for the voltage of the output signal to transition from 80% to 20% of the signal transition from a logical high to a logical low. In a typical signal distribution network 100, the buffer circuits should be designed to perform signal transitions from low to high or high to low within a maximum delay period. By adhering to maximum signal rise times and fall times, the skew and performance of the signal distribution network 100 and its buffer circuits will be more uniform and predictable.

When designing microprocessors, the layout of blocks is often accomplished through the use computer automated placement and routing programs. For circuits such as the signal distribution network 100 of FIG. 1, computer automated placement and routing programs are essential in aiding the designer to place and route the multitude of L4 and L5 buffer circuits and any associated flip-flops or flop-rows. Since the buffer circuits in levels 1 through 3 are typically larger, fewer in number, and are often remotely located outside of a block of components, the designers may choose to select the placement and routing of these buffers without the use of any computer automated placement and routing programs.

As should be apparent from the above discussion, signal distribution networks must be designed to minimize skew, maintain a sharp waveforms and maintain adequate signal strength. To this end, the buffers used in the distribution system must be carefully chosen. Not surprisingly, the detailed analysis required to support an integrated circuit designer in the development of a large signal distribution network is typically very time consuming and susceptible to error. Such analysis is further complicated in a the dynamic design environment, wherein other circuit designers tend to refine and modify the destination circuitry of the integrated circuit as required during the design process.

Thus, the amount of effort and time, and associated expenses, required to model the signal distribution network's circuitry and to calculate the resulting propagation delays and signal characteristics may be prohibitive. For example, in previous microprocessor design efforts, the modeling and analysis required to simply select L4 buffers took several months of dedicated circuit analysis by an engineer using circuit analysis tools, such as SPICE. As it is becoming increasingly important for microprocessors and other integrated circuits to proceed from conception, through design, and to market in a very short time, it would very desirable to provide the design engineers with methods and apparatuses which expedite the design process.

SUMMARY OF THE INVENTION

The present invention provides a system for quickly and automatically generating buffer data which can be used during integrated circuit design to select appropriate buffers for signal distribution networks. The buffer data generated in accordance with this invention may be used by either human designers or automated place and route systems. Either way, the buffer data ensures that buffers selected for the signal distribution network will keep skew to a minimum.

Generally, the invention generates buffer data in the following format. Incrementally varying network features or criteria are provided (in the form of a table or list for example). Examples of such features included the length of a line connecting an L4 buffer to one or more L5 buffers and the number of L5 buffers driven by a single L4 buffer. For each incremental value of the network feature or features, one or more buffer types is specified. These buffer types have been previously modeled in the environment of the incremental value of the network features and found to meet certain criteria necessary to minimize skew. In one example, the invention automatically generates a tabular representation having rows specifying numbers of L5 buffers driven by an L4 buffer, and columns specifying line lengths connecting the L4 buffer to L5 buffers. For each unique combination of line length and number of L5 buffers driven, one or more L4 buffer types is specified. If when designing a signal distribution network the designer (or design tool) chooses L4 buffers from the proper locations on the table, then skew should be minimized.

An important feature of the invention is the automated mode by which the buffer data are generated. Previously, suitable buffer data were generated manually. This process was fraught with error and tedium. To improve the design process, the present invention provides algorithms for automatically generating buffer data.

The methods of generating buffer data generally can be characterized as including the following steps: (1) providing a collection of buffer types available for use at a first stage of the signal distribution network; (2) providing a skew budget for signal propagation between the first stage and a next adjacent stage of said signal distribution network; (3) for the first stage of the signal distribution network, providing a range of incrementally varying values of at least one feature affecting skew; and (4) automatically selecting, for each of said incrementally varying values, one or more suitable buffer types from among the collection of buffer types. Note that the suitable buffer types are selected to meet the skew budget at a corresponding value of the at least one feature affecting skew.

In one embodiment, the step of automatically selecting one or more suitable buffer types may be performed generally as follows. Initially a table is generated having various combinations of (i) line length connecting buffers of said first stage to buffers of said next adjacent stage of the signal distribution network, and (ii) numbers of next adjacent stage buffers being driven by a buffer in the first stage. Then for each available buffer type, it is determined whether that buffer meets the skew budget for certain combinations of line length and number of next adjacent stage buffers.

First a specified number of next stage buffers being driven by the buffer under consideration is set. Then the following steps are performed: (1) identifying a right margin which represents a maximum acceptable line length from said first buffer to a specified number of next level buffers, and (2) identifying a left margin which represents a minimum acceptable line length from said first buffer to a specified number of next level buffers. At the right margin, the given buffer type, when connected to a line of the maximum acceptable line length, has a right margin delay of no more than about one or more of (a) a maximum high to low propagation delay from the output of the first buffer to the output of a next level buffer and (b) a maximum low to high propagation delay from the output of the first buffer to the output of a next level buffer. Similarly, at the left margin, the given buffer type, when connected to a line of the minimum acceptable line length, has a left margin delay of one or more of (c) a minimum high to low propagation delay from the output of the first buffer to the output of a next level buffer and (d) a minimum low to high propagation delay from the output of the first buffer to the output of a next level buffer.

The left and right margins may also require that the buffer type under consideration meet certain criteria in addition to the above-mentioned propagation delay criteria. For example, the buffer, when connected to a line of the specified length, may have to output signals having no more than a maximum signal rise time and a maximum signal fall time. Regardless of the criteria employed to identify the left and right margins, at least one of those margins will preferably be identified by a binary search algorithm.

Another aspect of the invention provides a system for generating buffer data for use in selecting suitable buffer types for placement at given locations in a signal distribution network during the design of a microprocessor. This system may be characterized as including (a) an input interface for accepting as input parameters (i) a collection of buffer types available for use at a first stage of the signal distribution network, (ii) a skew budget for signal propagation between the first stage and a next adjacent stage of said signal distribution network; (iii) a range of incrementally varying values of at least one feature affecting skew; and (b) a computational module for automatically selecting, for each of said incrementally varying values, one or more suitable buffer types from among the collection of buffer types, which suitable buffer types are selected to meet the skew budget at a corresponding value of the at least one feature affecting skew.

These and other features of the present invention will be presented in more detail in the following specification of the invention and the associated figures.

BRIEF DESCRIPTION OF THE DRAWINGS

FIG. 6 is a representational depiction of a clock buffer table.

DESCRIPTION OF THE PREFERRED EMBODIMENTS

Generally, the invention employs various process steps involving data provided to and from, and stored within computer systems. Useful machines for performing the operations of the present invention include general purpose digital computers or other similar devices. The present invention relates to method steps for operating such a computer in processing electrical or other physical signals to generate other desired physical signals.

The present invention also relates to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given below.

Figure 4:
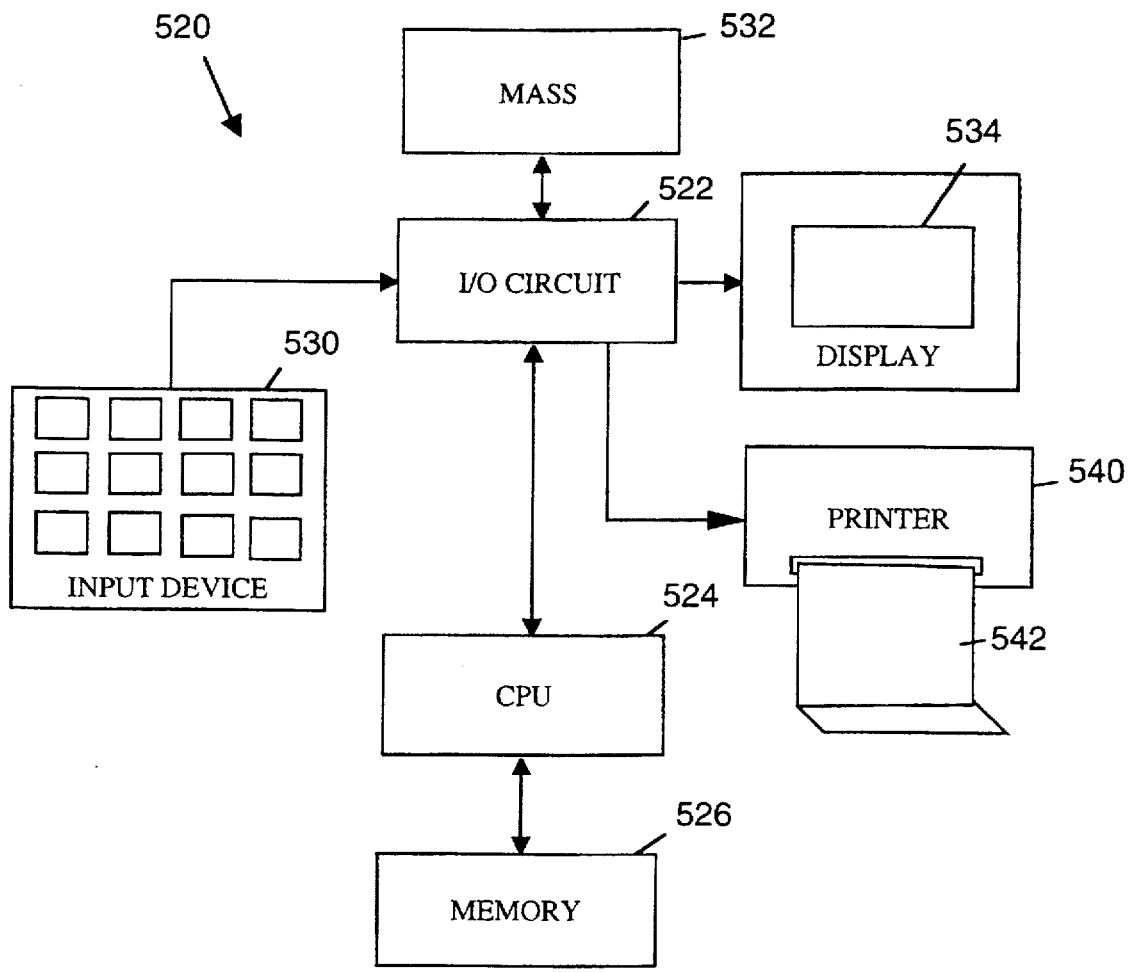
FIG. 4 is a block diagram of a representational computer system, suitable for use with the present invention.

FIG. 4 is a block diagram of one suitable computer-based system for implementing the present invention. Shown is a computer 520 which includes an input/output circuit 522 used to communicate information in appropriately structured form to and from the parts of computer 520 and associated equipment, a central processing unit 524, and a memory 526. These components are those typically found in most general and special purpose computers 520 and are intended to be representative of this broad category of data processors.

FIG. 4 also is an input device 530 shown as a keyboard. It should be understood, however, that the input device 530 may actually be a network connection, a tablet and stylus, a voice or handwriting recognizer, or some other well-known input device such as, of course, another computer. A mass memory device 532 is coupled to the input/output circuit 522 and provides additional storage capability for the computer 520. The mass memory device 532 may be used to store programs, data and the like and may take the form of a magnetic hard drive, semiconductor memory, or some other well known device. It will be appreciated that the information retained within the mass memory device 532, may, in appropriate cases, be incorporated in standard fashion into computer 520 as part of the memory 526.

In addition, a display monitor 534 is illustrated which is used to display the images being generated by the present invention. Such a display monitor 534 may take the form of any of several well-known varieties of conventional cathode ray tube displays, flat panel displays, thin CRT displays, or some other well known type of display.

Also shown, is a printer 540 and printer output 542. Printer 540 is device that receives control and data signals from the CPU 524, typically through I/O circuit 522, which cause the printer 540 to generate a printer output 542. Such a printer 540 may be a laser printer or plotter, a dot-matrix printer, a thermal printer, a pen plotter, or some other well known type of printer. Printer output 542 may be an opaque or transparent sheet or roll of paper or synthetic mixture, or some other well known type of printer output.

As is well-known, the memory 526 may store programs which represent a variety of sequences of instructions for execution by the central processing unit 524. For example, the compiled test programs for executing on a device under test may be stored within the memory 526.

Suitable computers for use in implementing the present invention may be obtained from various vendors. In one preferred embodiment, an appropriately programmed Sun SPARC Station (Sun Microsystems, Mountain View, Calif.) may be used to perform the steps associated with this invention. Other suitable computers include mainframe computers such as a VAX (Digital Equipment Corporation, Maynard, Mass.) or Cray Supercomputer (Cray Research), multiprocessor computers such as those produced by Thinking Machines (Cambridge, Mass.), workstations such as the HP735 workstation (Hewlett Packard, Palo Alto, Calif.) or Silicon Graphics machines (Silicon Graphics, Mountain View, Calif.), personal computers such as Macintosh computers (Apple Computer, Cupertino, Calif.) or IBM or IBM compatible personal computers.

It should be understood that the present invention also relates to machine readable media on which are stored signal distribution designs produced in accordance with the requirements of this invention, or program instructions for performing methods of this invention. Such media include, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Furthermore, program instructions implementing the process of this invention are typically provided on a computer readable medium such as one of those described above and will sometimes be transported over a communications network.

While the present invention may be implemented in many different ways, it is preferably implemented as a software routine employed along with circuit analysis tools which are capable of modeling signal propagation through various electronic components, such as transistors, resistors and capacitors of an integrated circuit. In a preferred embodiment, the circuit analysis tool is HSpice available from Metasoft of San Jose, Calif.

A preferred embodiment of present invention provides an automated process that generates buffer sizing data, in a tabulated format, relating to a first level (e.g., L4) and one or more second level (e.g., L5) buffer circuits that are part of a control block or other module in an integrated circuit such as a microprocessor. This tabulated buffer data is utilized in conjunction with other processes to assist the designer in determining the selection of circuit components and the coupling of these components in an integrated circuit.

Figure 5:
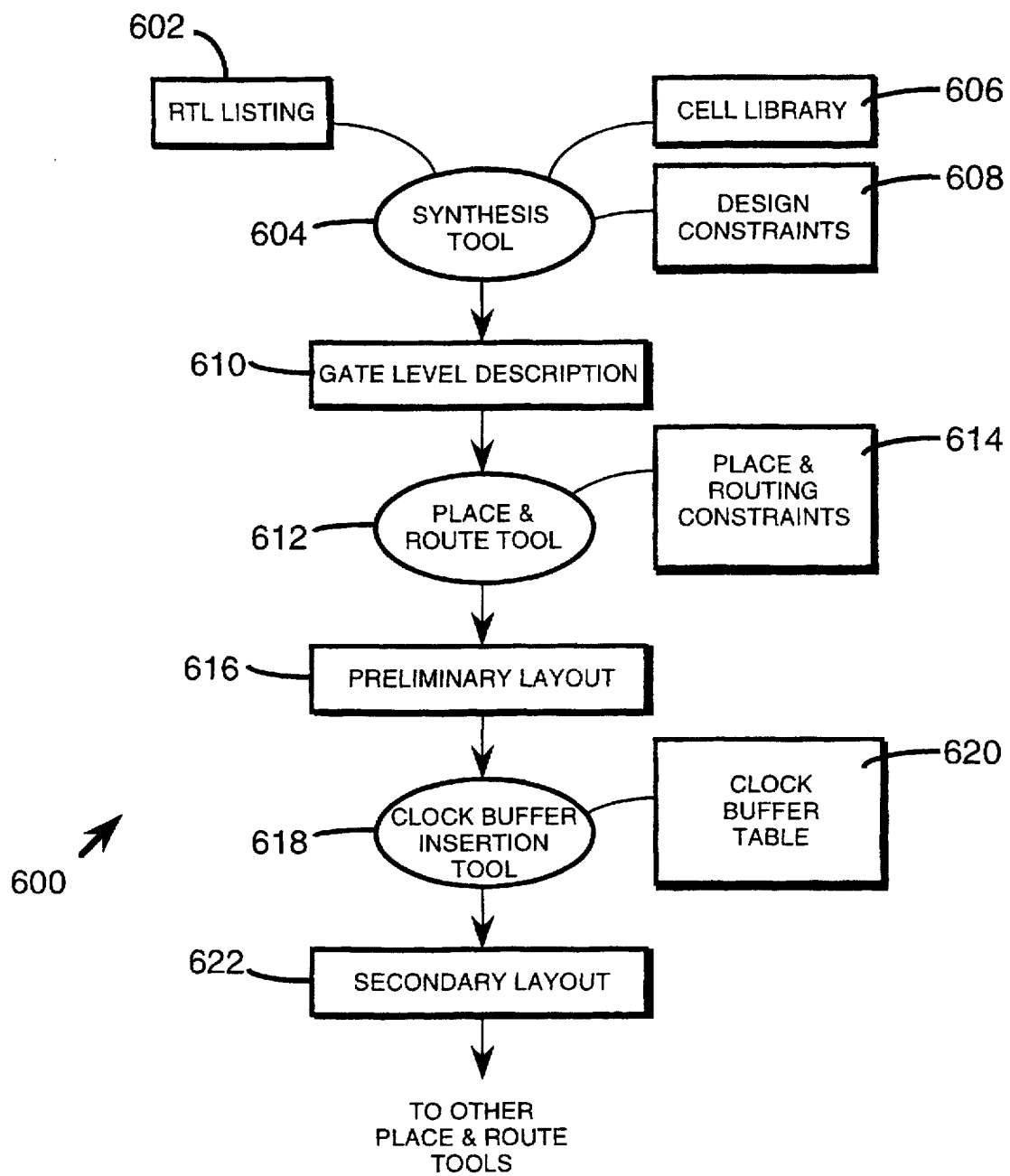
FIG. 5 is a partial process diagram depicting the particular steps of a typical integrated circuit design process.

To illustrate the role of such table in the design process, a partial integrated circuit design process 600 is shown in FIG. 5. The partial integrated circuit design process 600 includes some initial steps employed to produce a control block. The process typically includes supplying an initial RTL listing 602, associated with the logical construct of the logical circuits being designed, to a synthesis tool 604. Note that the RTL listing 602 can provide no physical or layout information because it is provided in a hardware design language such as Verilog.

The synthesis tool 604 considers the RTL listing 602 data along with a cell library 606 and a design constraints 608 to produce a gate level description 610. The cell library 606 contains various defined circuits such as logic gates used by synthesis tool 604 to implement the abstract RTL listing functions as concrete circuitry. Such cell libraries are widely used by enterprises responsible for designing integrated circuits. Design constraints are employed to specify which of the cells available in library 606 may be employed for the design task at hand. A suitable synthesis tool is the Synopsis Compiler produced by Synopsis, Inc. of Mountain View, Calif.

The gate level description 610 is a schematic representation of the block being designed. Aside from specifying how circuit elements are connected to one another, this description does not specify how circuit elements are to be laid out on a semiconductor die. To begin the layout process, gate level description 610 is supplied to a place and route tool 612, which considers any place and routing constraints 614 (provided by the designer) to produce a preliminary layout 616. A suitable place and route tool is the Arccell BV produced by Avanti Corp. of Sunnyvale, Calif. The preliminary layout specifies the locations of buffers in a signal distribution network, but does not specify which specific buffer types are to be employed in this region.

The preliminary layout 616 is supplied to a clock buffer insertion tool 618 which utilizes a clock buffer table 620 to produce a secondary layout 622. The clock buffer insertion tool 618 inserts appropriate clock buffers at the locations specified in the preliminary layout 616. Types of clock buffers are specified in table 620 for use under various sets of conditions. As explained in more detail below, those conditions pertain to the buffer's location in the signal distribution network. To choose the correct clock buffer, table 620 is consulted.

The secondary layout 622 contains all information relating to the clock distribution system in a particular control block being generated. Typically, the control block will specify the locations of L4 and L5 buffers. That secondary layout may be supplied to other design tools which integrate the control block with other integrated circuit modules.

The present invention provides an automated process for generating the clock buffer table 620 for use in the partial integrated circuit design process 600. Preferably, buffer table 620 specifies for each type of available L4 buffer circuit the range of line lengths over which that L4 buffer circuit may be used to drive a specified number of L5 buffer circuits.

FIG. 6 presents an example clock buffer table 620 produced in accordance with the present invention. As shown, the clock buffer table 620 provides columns specifying incrementally varying values of line length—which line lengths represent lines connecting a given L4 buffer to one or more L5 buffers. In the exemplary table shown in FIG. 6, the line lengths are specified in increments of 100 μm (e.g., the second column specifies L4 to L5 line lengths o100–199 μm). Of course, other incremental variations in line length may be specified in the columns of the table. Note that clock buffer table 620 is generated utilizing an assumption that the electrical characteristics of a conductive line will be sufficiently uniform for a given unit of line length. In more sophisticated versions, the table could account for lines of different current carrying characteristics.

As shown in the FIG. 6 table, the individual rows specify incrementally varying values of the number of L5 buffers driven by a given L4 buffer. For example, the first row specifies that the L4 buffer drives only a single L5 buffer, while the second row specifies that the L4 buffer drives two L5 buffers, the third row specifies that the L4 buffer drives three L5 buffers, etc.

Obviously, the number of L5 buffers driven by a given L4 buffer affects the propagation time between the L4 buffer and the L5 buffers. Thus, the ideal L4 buffer for minimizing skew at a location driving two L5 buffers would not necessarily be the ideal buffer at a location driving five L5 buffers. Likewise, the ideal L4 buffer for one line length would not necessary be the ideal L4 for a different L4 buffer.

As shown, clock buffer table 620 is populated with various L4 buffer types which are given arbitrary identifying names (e.g., 1X, 2X, 3X, 4X, 5X 6X . . . ). Each buffer type represents a structurally different buffer. A given L4 buffer circuit type identified in a unique location of table 620 indicates that that particular type has been determined to meet the skew budget for signal propagation. For a single driven L5 buffer circuit, a "1X" L4 buffer circuit may be used if the line length is between 100 and 399 μm, and alternatively a "2X" L4 buffer circuit may also be used if the line length is between 200 to 399 μm. For an L4 buffer to drive three L5 buffers over a line length of between 200 to 299 μm, a "3X", "4X", or "5X" type L4 buffer would be appropriate.

In situations where more than one type or size of L4 buffer circuit may be used the circuit designer may choose one from the tabulated listing of identified (i.e., acceptable) L4 buffer circuits. For example if three L5 buffer circuits need to be driven and the longest line length is about 150 μm then, according to the example in FIG. 6, the designer may choose to use from either the "3X", "4X", or "5X" types of L4 buffer circuits.

In a preferred embodiment, the table is provided with only a single preferred buffer circuit for each unique combination of line length and number of L5 buffers driven. Thus, if the system of this invention determines that multiple L4 buffers are appropriate for a given combination, then a designer or the system itself would select one of these multiple L4 buffers as the "best" L4 buffer and eliminate the other suitable L4 buffers from the table entry.

While the example shown in FIG. 6 shows line length and number of driven L5 buffers as parameters dictating selection of L4 buffers, there is in principle no reason why other skew-related parameters could not be employed in place of or in addition to these parameters. Further, such tables could be used to select circuit elements other than L4 buffers. L4 buffers were simply chosen because they are elements whose locations are fixed in signal distribution networks by place and route design tools. It should also be noted that the above examples assume that each L5 buffer presents an identical load to the L4 buffer. While this is the case in some designs, it not necessary and the present invention can be applied to such situations.

A buffer table such as clock buffer table 620 is generated by modeling the signal propagation characteristics of L4 buffers in the context of line lengths connecting the L4 and L5 buffers and the number of L5 buffers driven by the L4 buffer. The modeled signal propagation characteristics are compared with acceptable skew limitations. These limitations are preferably expressed in terms of signal propagation delays from logical low to logical high and from logical high to logical low. In addition, the modeled signal may be required to meet other criteria such as having the rise and fall times of less than a defined maximum, etc. Preferably, the modeling is conducted with a circuit analysis tool such as HSPICE.

Conventionally, a designer generates each entry in a buffer table such as table 620 by running HSPICE for various L4 buffer types under the conditions specified by the table entry under consideration. Ultimately, one or more L4 buffers meeting the design criteria are identified for each table entry. Not surprisingly, this is a time consuming and tedious process. As noted, the present invention improves on this procedure by automating table generation.

Figure 7A:
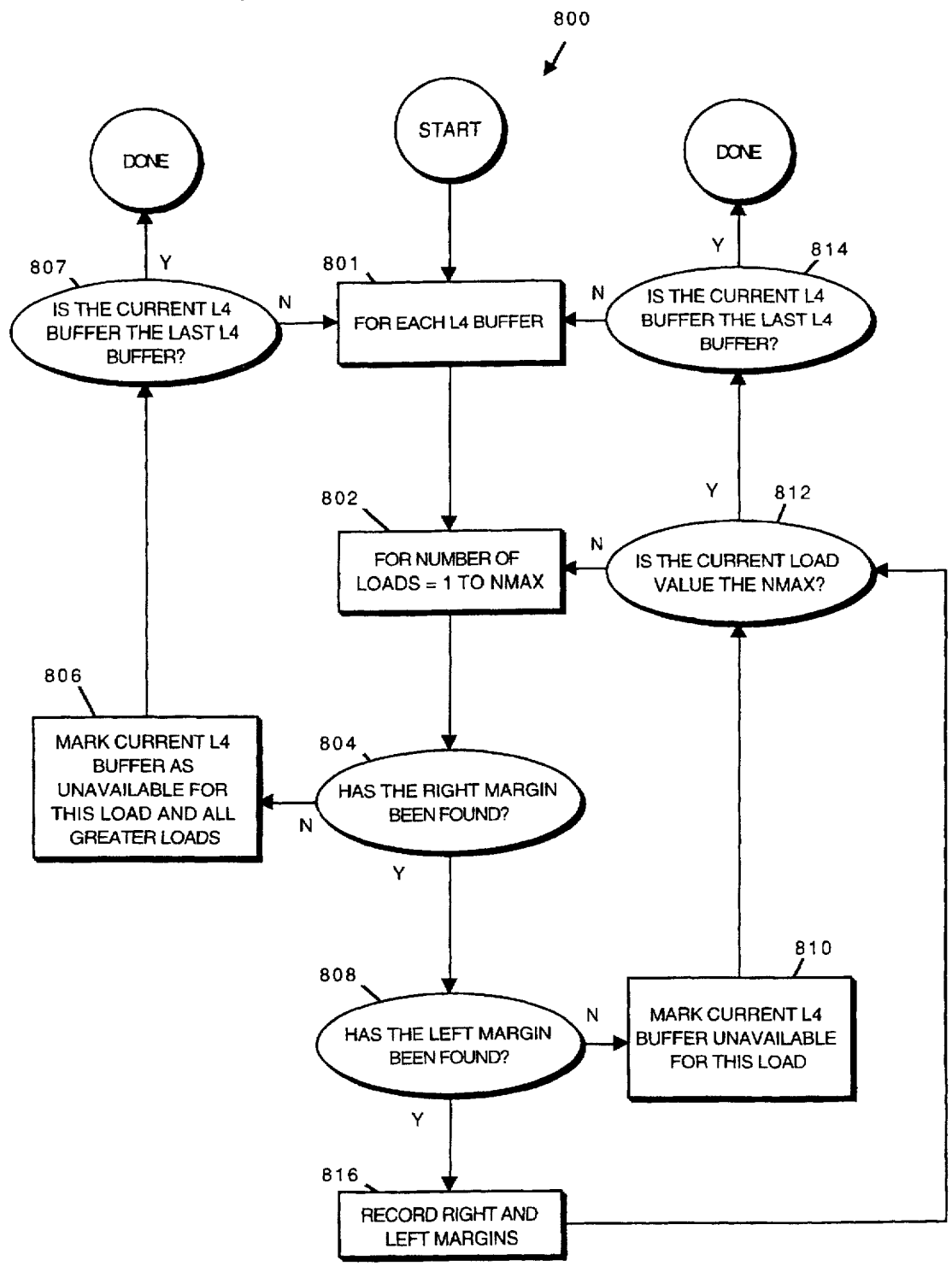
FIGS. 7a–7c are process flow diagrams of a method for generating buffer circuit sizing data in accordance with this invention.

FIG. 7a is a process flow diagram depicting the steps associated with automatically generating buffer circuit sizing data in accordance with a preferred embodiment of this invention. A buffer data generating process 800 preferably is part of a computer implemented program of instructions. As depicted, the buffer sizing data generating process 800 is preferably an iterative process that may be embodied in a set of computer instructions, or software instructions, for use in a computer system, or may be embodied in a hardware circuit configuration, or a combination thereof. The buffer sizing data generating process 800 is iterated at steps 801 and 802 to specify respectively the type of L4 buffer circuit and the number of L5 buffer circuits to be driven (given by the variable "n"). Steps 804 and 808 iteratively specify the line lengths, or ranges of line lengths, connecting the L4 and L5 buffer circuits. These iterative steps will be detailed below with reference to FIGS. 7b and 7c.

Figure 7B:
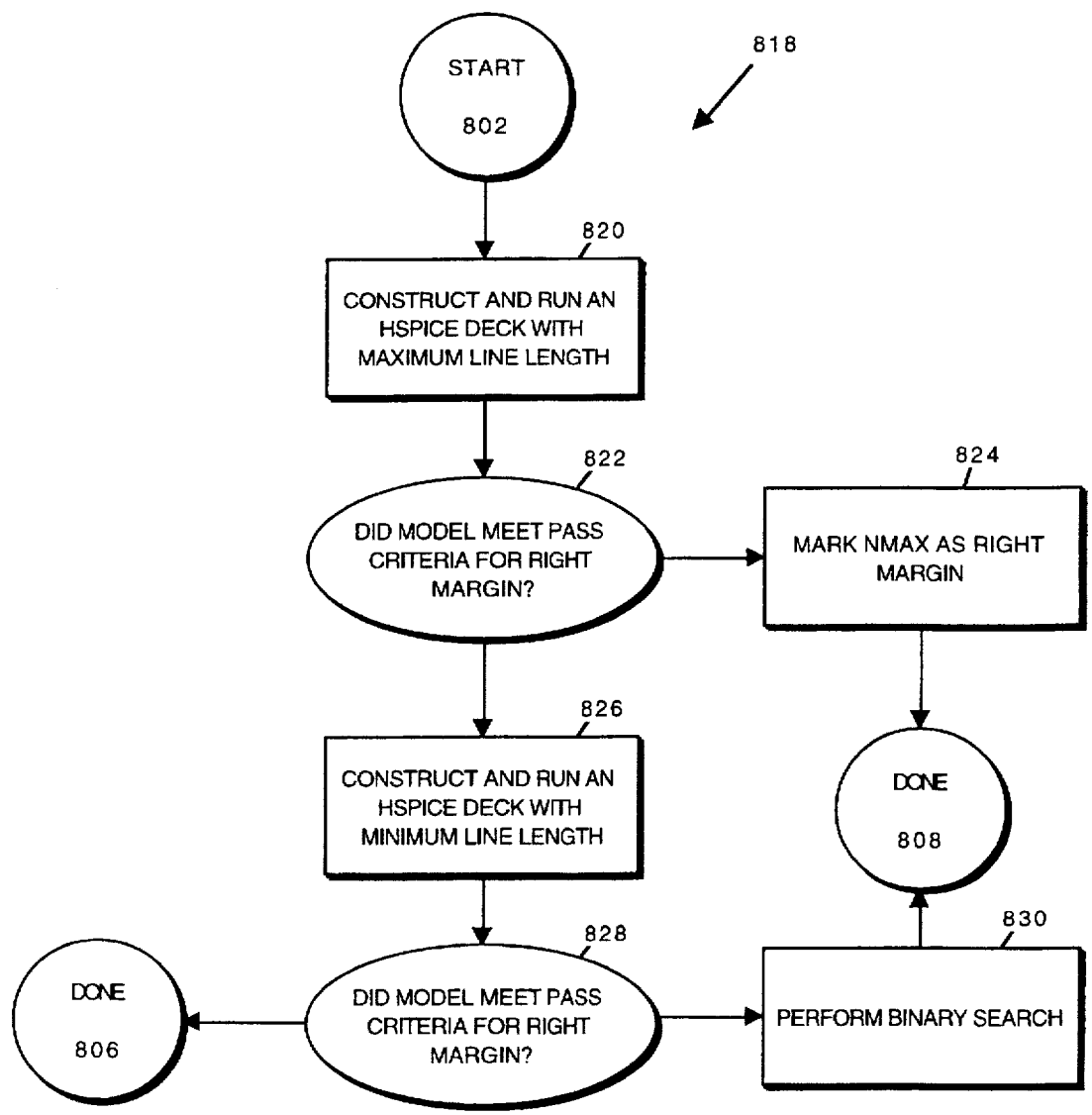
Figure 7C:
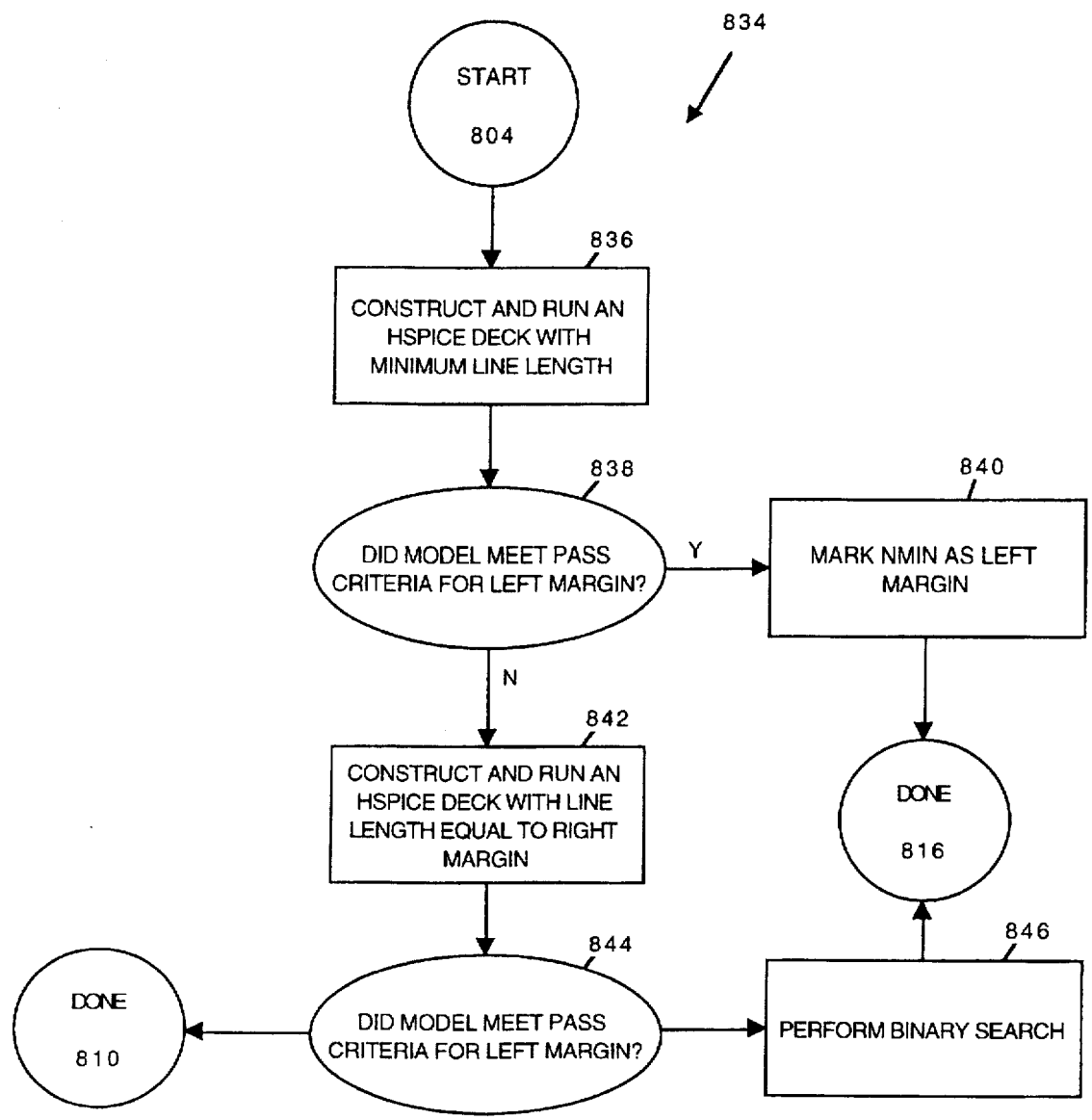

Preferably, the computer system for implementing the process of FIGS. 7a–7c (including software, firmware, and/ or hardware) includes at least two components. First, it will include some form of input interface for accepting the various inputs required to execute the process of FIGS. 7a–7c. Such inputs may include, for example, the performance criteria, buffer table parameters such as incremental line lengths, etc. In addition, the system will require a computational module for executing the procedures recited in FIGS. 7a–7c (e.g., iterations, binary searching, and calculations). These two elements may be provided as separate modules or be integrated into a single module at the option of the designer.

The present invention utilizes the electronic characteristics of a specified collection of available L4 and L5 buffer circuits and the electrical characteristics of a conductive line used to couple the L4 buffer circuits to an L5 buffer circuit. The conductive line may be a wire, a via, a channel, or other suitable electrical connection consisting of a metal or other suitable conductive or semiconductor material. In a preferred embodiment, the electrical characteristics, such as the resistance and capacitance of the conductive line, are based on a given measured unit of line length. In other embodiments, such electrical characteristics may also be based on other units of measurement, such as depth, width, surface area, and even volume.

For each of the available L4 buffer circuits, the process automatically generates buffer sizing data which specifies the number of L5 buffer circuits capable of being driven by a selected L4 buffer circuit over a specified range of line lengths in accordance with the skew budget's limitations (see table 620 for example).

In order to expedite the process of populating a table, a right margin and a left margin within a given row of the table may be determined for each type of L4 buffer circuit. The right margin represents the maximum acceptable line length from the output of the L4 buffer circuit to the input of the most distant L5 buffer circuit. The right margin is determined from a comparison of the modeled signal propagation delays with specified maximum signal propagation characteristics. The right-most line length at which modeled delay meets the maximum propagation characteristics constitutes the right margin. Conversely, the left margin is the minimum acceptable line length from the output of the L4 buffer circuit to the input of the closest L5 buffer circuit. The left margin is determined from a comparison of the modeled signal propagation delays with specified minimum signal propagation characteristics.

Following steps 801 and 802 (which specify a type of L4 buffer circuit and a specific number of L5 buffer circuits), the system determines whether the right margin has been found at a decision step 804. Step 804 will be described in more detail below with reference to FIG. 7b. For now, it is sufficient to understand that this step includes a computer automated process that composes and runs a test layout of the conductive means and the L4 and L5 buffer circuits. The test layout includes the number of L5 buffers driven by the L4 buffer as well as the wire length connecting the L4 buffer to the L5 buffers.

If no right margin has been found (that is step 804 has been answered in the negative), a step 806 will then record that no right or left margin exists for the selected row (i.e., there are no line lengths over which the L4 buffer circuit can successfully drive the specified number of L5 buffer circuits). At this point, it can be assumed that the L4 buffer under consideration will not work for any value of n (the number of L5 buffers) greater than the current value. This is because the additional load supplied by more L5 buffers will further slow the propagation delay. Because no line length was short enough to meet a maximum propagation delay required (as indicated by the failure to find a right margin), then all cases having additional L5 buffers will likewise not have a sufficiently short line length. As a result, it can be assumed that no right margin will be found for any value of n greater than the current value. Thus, step 806 marks the current L4 buffer as unusable for not only the current value of n but all greater values of n as well. From step 806, a decision step 807 determines whether the current L4 buffer is the last L4 buffer to be considered in the process 800. If so, the process is complete. If not, process control returns to step 801 where the next L4 buffer is considered.

If a right margin has been found (i.e., step 804 is answered in the affirmative) the process proceeds to a decision step 808 which performs a similar function to step 804. Specifically, decision step 808 determines whether the system has found a left margin. This step is implemented as a computer automated process that composes and runs a test schematic directed for finding the left margin. As noted, the left margin represents the minimum line length that will have a sufficiently long propagation delay to meet the desired skew budget. The process of determining whether the left margin exists (and if so where) will be discussed in more detail below with reference to FIG. 7c.

If it is determined at step 808 that no left margin exists for the current values of L4 and n, a process step 810 marks the current L4 buffer as unusable for the current value of n. Thereafter, a decision step 812 determines whether the current value of n is equal to the maximum value of n (nmax) for the buffer data being generated. If not, process control is then returned to step 802 where the value of n is incremented by 1. If so, the next type of L4 buffer (if any) must be considered. Therefore, if step 812 is answered in the affirmative, a decision step 814 then determines whether the current L4 buffer is the last L4 buffer that needs to be considered. If so, the process is completed. If not, process control returns to step 801 where the next L4 buffer is considered.

If decision step 808 determines that a left margin has been located, process control is directed to step 816 where both the left and right margins are recorded for the selected row. Also, in this case, any column cells (i.e., line lengths) between the left margin and the right margin will be recorded as being acceptable for the selected row (i.e., the specified L4 buffer circuit is capable of driving the specified number of L5 buffer circuits for all line lengths between the left and right margins). Thus, at this point in the buffer sizing data generating process 800, the analysis for the selected row (i.e., number of L5 buffer circuits) has been completed and the acceptable line lengths have been identified. After the margins have been recorded at step 816, process control is directed to step 812, where the process continues as described above.

Those skilled in the art will recognize that several known searching and programming schemes may be incorporated into the buffer sizing data generating process 800 to produce or increase throughput and efficiency of the process. In a preferred embodiment, the process includes a binary searching algorithm and a routine to merge the tables created for several different type or size of L4 buffer circuits into a single, unified table. The individual or merged tables may be formatted and supplied to other programs and tools associated with integrated circuit design (as described above). Of course, the generated buffer sizing data also may be displayed on computer displays or printed via computer terminals connected to printers. It is also recognized that the present invention may be adapted to produce a three dimensional table which includes different types of L5 buffer circuits as well. One logical extension is the use of process 800 to generate three dimensional tables including different types of L5 buffer. The above description assumes that all L5 buffers have the same propagation characteristics.

As noted a binary search algorithm may be employed to identify the right and left margins, if any. As recognized by those skilled in the art, a basic binary searching algorithm iteratively halves or otherwise bisects the search field or data set until the targeted data is located, or isolated/excluded from the set. Such algorithm will require at most log2(n) tries to find a margin from n options. While a binary search algorithm is not necessary to the practice of this invention, in those embodiments in which such search algorithm is employed, it may be implemented as follows.

A process 818 of determining whether a left margin exists, and if so where, will described with reference to FIG. 7b. Note that this process corresponds to step 804 in FIG. 7a. The process begins after step 802 (FIG. 7a) and at a step 820, the system generates and runs a model (preferably provided as a SPICE deck) including the L4 buffer currently under consideration connected to a specified number of L5 buffers (step 802 of FIG. 7a). In the model, the L4 buffer is connected to the L5 buffers by a line length equal to the maximum value of line length in table 620.

After the model has been run, a step 822 determines whether the modeled system meets the criteria for the right margin. If so, the right margin is noted to be the largest line length available in table 620 at a step 824. The search process 818 is complete at this point, with process control being directed to step 808 in process 800.

If the model system generated and run at step 820 fails the test (i.e., step 822 indicates failure), a process step 826 generates and runs a model including the current L4 buffer connected to the current number of L5 buffers by a line length equal to the minimum value of line length in table 620. The result of the model run is then compared with the pass criteria at a decision step 828. If the model fails, then it can be assumed that the no right or left margins exist for the currently modeled values of L4 and number of driven L5 buffers. Thus, if step 828 indicates failure, process 818 is complete with process control being directed to step 806 of process 800.

Finally, if step 828 indicates that the minimum value of line length produced a passing circuit arrangement, the right margin must lie either at the minimum line length or somewhere between the minimum and maximum line lengths. To expeditiously located the right margin, a process step 830 performs a binary search to locate the right margin. Once that margin is located, the process 818 is completed with process control being handed off to step 808 of process 800.

If a binary search is performed as specified in step 830, it preferably proceeds as follows. First, the middle line length between the leftmost and rightmost line lengths is tested. If it passes, then a new line length is chosen midway between the middle and longest line lengths. If it does not pass, then a new line length is chosen midway between the middle and shortest line lengths. The search algorithm continues bisecting in this manner until a right margin is unambiguously identified.

In the flow chart shown in FIG. 7b, steps 822 and 828 determine whether the right margin has been located for a given L4 buffer type. As part of that inquiry, the table generation tool determines whether the L4/L5 buffers combination meets certain signal propagation characteristics. In a preferred embodiment, these criteria include the following: (1) the maximum propagation delay from low to high, (2) the maximum propagation delay from high to low, (3) the maximum rise time and (4) the maximum fall time. Specifically, the low to high propagation delay from the L4 input to the L5 input must be less than the maximum delay from low to high. Similarly, the high to low propagation delay between the same two points must be less than the maximum delay from high to low. Further, the output from the L4 buffer must have a rise time that is no greater than a predefined maximum. Similarly, the output of the L4 buffer must have a fall time that is no greater than a predefined maximum. In one specific embodiment, the maximum rise and fall times are set at about 240 picoseconds.

Figure 1:
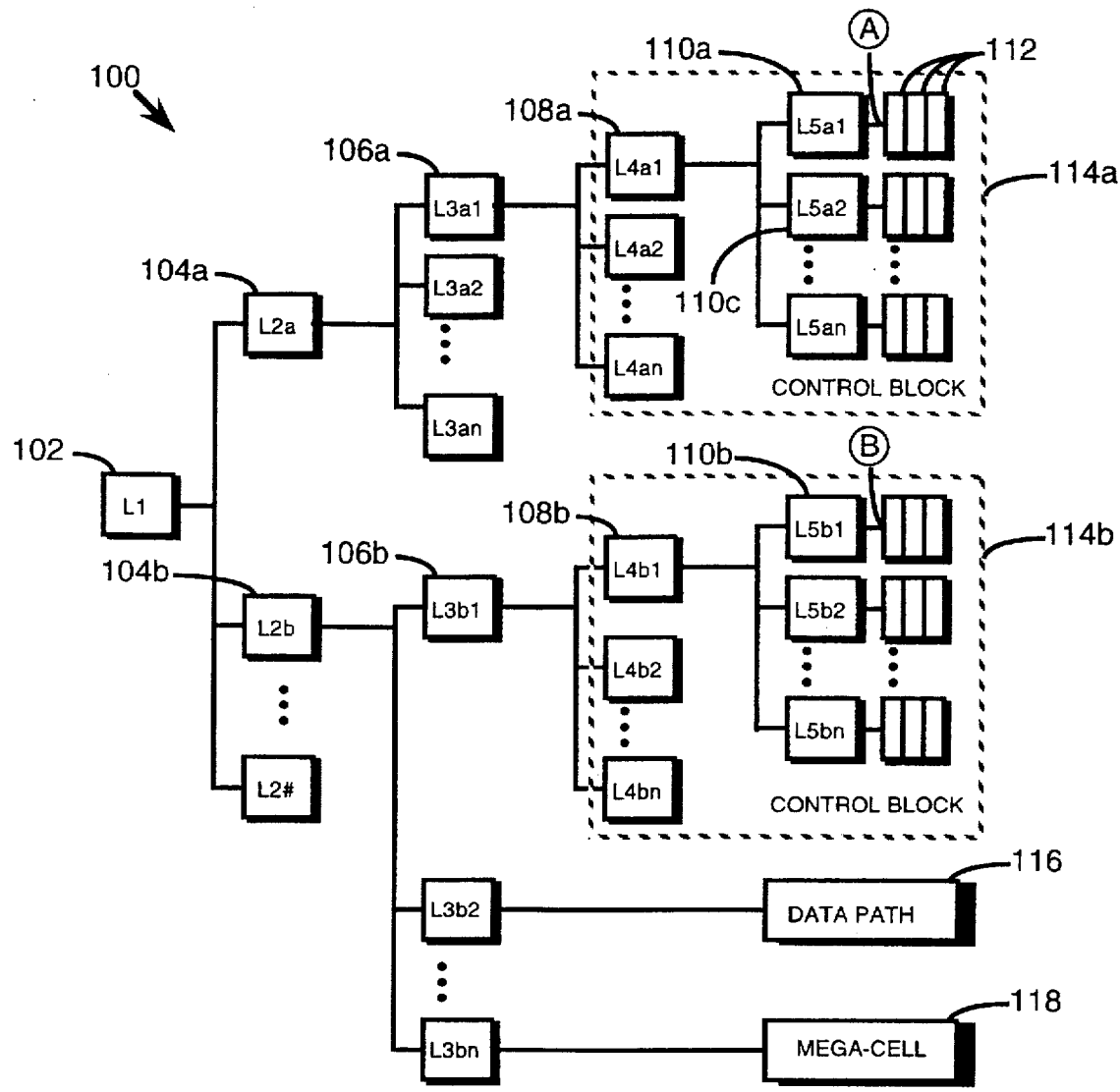
FIG. 1 is a block diagram of a representative signal distribution network for an integrated circuit.
Figure 2:
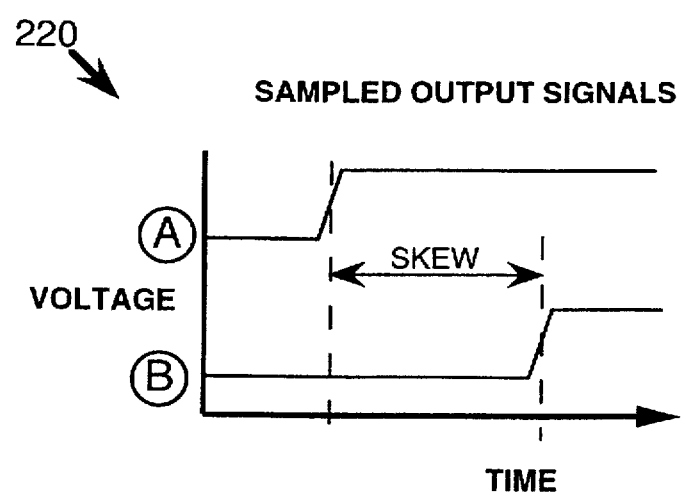
FIG. 2 is a signal diagram illustrating the concept of skew, as applied to FIG. 1.
Figure 3:
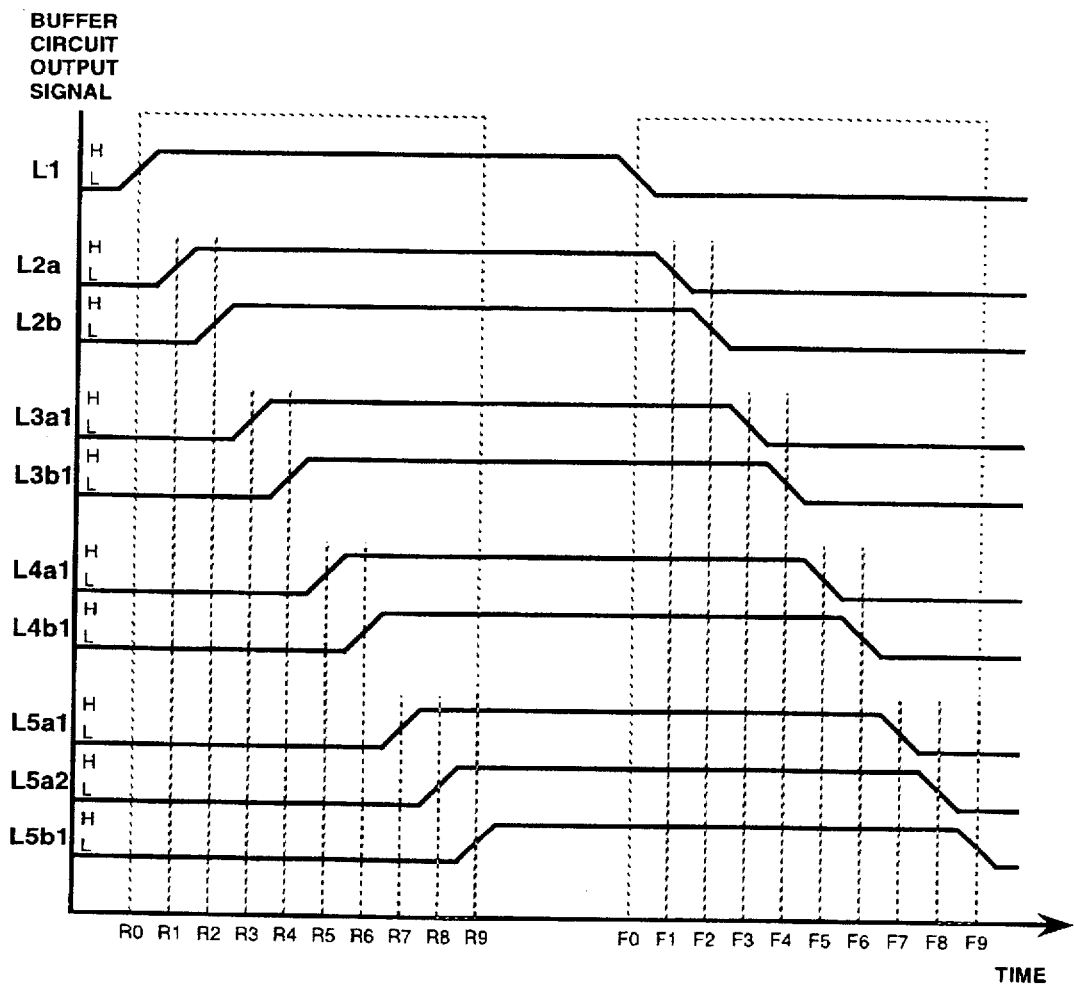
FIG. 3 is an graph depicting a timeline illustrating the concept of skew over several levels of buffer circuits.

The low to the high and high to low propagation delays are illustrated in FIG. 3. As shown in that figure, a waveform L4a1 is presented at the input of the L4 buffer under consideration. A waveform L5a1 is presented at the input of the L5 buffer receiving the output from the L4 buffer under consideration. Initially, the signal is low, and then undergoes a transition to the high state at R5. As shown in FIG. 3, the distance between R5 and R7 constitutes the propagation delay for the low to high transition of the L4 buffer under consideration. After the low to high transition, the signal at the input of the L4 buffer undergoes a high to low transition at F5. Similarly, the corresponding transition in signal L5a1 occurs F7. The time delay between points F5 and F7 constitutes the high to low propagation delay of the clock signal. As mentioned, to find the right margin of the L4 buffer as indicated at step 804 of FIG. 7a, the L4 buffer under consideration must have a low to high delay that is less than a defined maximum and it must also have high to low delay that is less than another maximum value. In a specific embodiment, the maximum value of the low to high delay and high to low delay is on the order of a few hundred picoseconds.

As indicated in FIG. 7a, a decision step 808 determines whether the left margin of the L4 buffer table has been identified. The criteria employed to make this determination are very similar to those employed to identify the right margin. Again, the rise and fall times of the signal output by the L4 buffer must be no greater than predefined maximum values. Typically, those maximum values will be the same as are employed located to the right margin. In addition, the low to high propagation delay and high to low propagation delay are employed to identify the left margin. However, rather than specifying that these delays be below a specific maximum, it is required that the delays be above a specified minimum. Thus, some propagation delays may be too small to meet the criteria required to identify the left margin. In one specific embodiment, the minimum low to high delay and high to low delay is set at a few hundred picoseconds (but at lower values than the corresponding maximum propagation delays).

Figure 8:
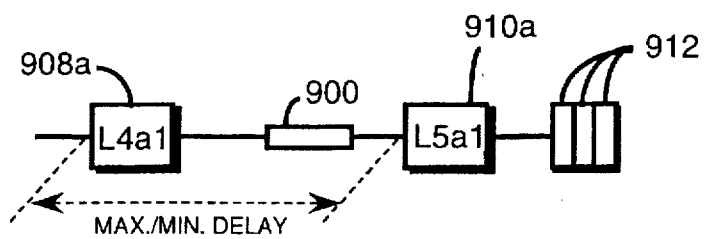
FIG. 8 depicts a representative circuit modeling approach for determining the propagation delays for a single L5 buffer circuit.
Figure 9:
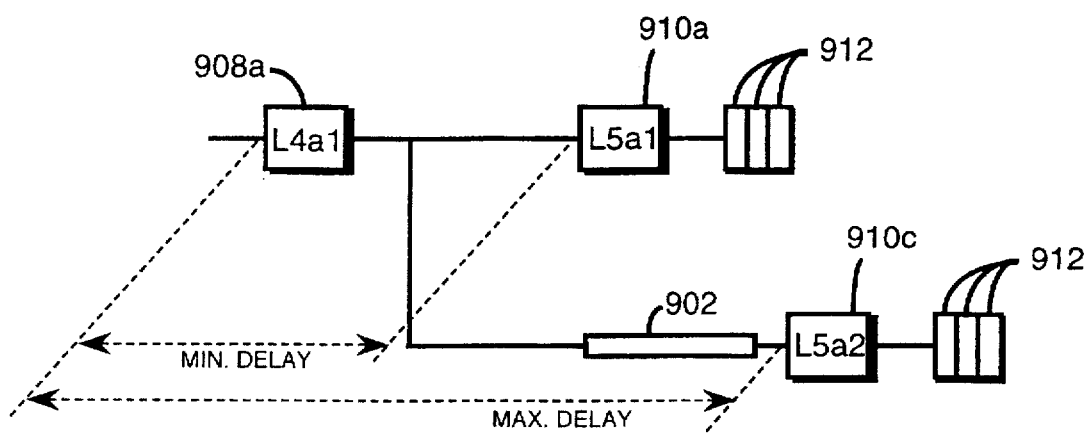
FIG. 9 depicts a representative circuit modeling approach for determining the propagation delays for multiple L5 buffer circuits.

To illustrate a preferred circuit modeling approach for identifying the right margin, FIGS. 8 and 9 depict, respectively, circuit models used to predict signal propagation delays between an L4 buffer circuit and a single L5 buffer circuit, and an L4 buffer circuit and a plurality of L5 buffer circuits. Preferably both of these modeling approaches are embodied in step 804. Such modeling approaches are based on an assumption that the electrical characteristics of the conductive mediums are reasonably uniform over the range of line lengths being modeled.

In FIG. 8, an L4a1 buffer circuit 908a is coupled to receive an input signal from a previous level circuit (not shown), and to supply an output signal to a single L5a1 buffer circuit 910a through a conductive means represented by an RC mega-wire 900. The RC mega-wire 900 possesses the electrical characteristics of the conductive means coupling the output of L4a1 buffer circuit 908a to the input of the L5a1 buffer circuit 910a. The electrical characteristics of the RC mega-wire 900 include the wire's resistance and capacitance. In more sophisticated models, the wire's inductance or other properties may be included.

As depicted in FIG. 8, there is essentially a single delay time as measured from the input of the L4a1 buffer circuit 908a to the input of the L5a1 buffer circuit 910a. Note, that the delay times may be slightly different for a signal transitioning from a logical low to a logical high, versus a signal transitioning from a logical high to a logical low. However for illustration purposes each of these will be considered to be the approximately the same.

FIG. 9 illustrates preferred modeling approaches for measuring signal propagation delays in a circuit configuration having an L4 buffer circuit driving at least two L5 buffer circuits. As depicted, the circuit is essentially the same as that shown in FIG. 8 with the exception of an additional conductive means between the output of the L4a1 buffer circuit 908a and the input of an L5a2 buffer circuit 910b; represented by a longer-delay RC mega-wire 902.

As with the model circuit shown in FIG. 8, the model circuit in FIG. 9 includes a signal propagation delay from the input of the L4a1 buffer circuit 908a to the input of the L5a1 buffer circuit 910a. The delay over this path (generally from the input of the L4 buffer to the input of the closest L5 buffer) is used to find the right margin. The signal propagation delay for purposes of finding the left margin, however, now exists between the input of the L4a1 buffer circuit 908a and the input of the L5a2 buffer circuit 910b as a result of the electrical characteristics associated with the longer-delay RC mega-wire 902. Generally, the left margin is identified by evaluating the signals at the input to the L4 buffer and the input to the second closest L5 buffer.

Thus, while the electrical characteristics of the connection between the line connecting the L4 buffer 908a to the closest L5 buffer 910a and of the longer-delay RC mega-wire 902 may be essentially equal, the line length of the longer-delay RC mega-wire 902 may be significantly greater than the line length of the RC mega-wire 900. This additional line length may be sufficient to cause greater signal propagation delays. This is particularly true for integrated circuits, wherein the dimensions of the circuit components and the line lengths of the conductive means are usually extremely small and wherein the propagating signals often transition between logical states millions of times each second. Note that in calculating left margin for the case of multiple L5 buffers, variation in the length of mega-wire 902 is used as the model variable to find the left margin.

A process 834 for identifying the left margin will now be described with reference to FIG. 7c. Note that this process corresponds to step 808 in FIG. 7a. The process begins after step 804 (FIG. 7a) and at a step 836, the system generates and runs a model (preferably provided as an HSPICE deck) including the L4 buffer currently under consideration connected to a specified number of L5 buffers (step 802 of FIG. 7a). In the model, the L4 buffer is connected to the L5 buffers by a line length equal to the minimum value of line length in table 620. Thus, while the method of finding a right margin starts by modeling the maximum line length, the method of finding a left margin starts by modeling the minimum line length.

After the model has been run, a step 838 determines whether the modeled system meets the criteria for the left margin. If so, the left margin is noted to be the largest line length available in table 620 at a step 840. The search process 834 is complete at this point, with process control being directed to step 816 in process 800.

If the model system generated and run at step 836 fails the test (i.e., step 838 indicates failure), a process step 842 generates and runs a model including the current L4 buffer connected to the current number of L5 buffers by a line length equal to the value of right margin line length as determined in process 818. The result of the model run is then compared with the pass criteria at a decision step 844. If the model fails, then it can be assumed that the no left margin exists for the currently modeled values of L4 and number of driven L5 buffers. Thus if step 844 indicates failure, process 834 is complete with process control being directed to step 810 of process 800 (i.e., there is no line length which can be used with the current L4 buffer to drive the specified number of L5 buffers).

Finally, if step 844 indicates that the right margin value of line length produced a passing circuit arrangement, the left margin must lie either at the right margin line length or somewhere between the minimum and right margin line lengths. To expeditiously located the left margin, a process step 846 performs a binary search to locate the left margin. Once that margin is located, the process 834 is completed with process control being handed off to step 816 of process 800.

If a binary search is performed as specified in step 846, it preferably proceeds as described above with respect to step 830 of process 818 (FIG. 7b). Thus, the search algorithm continues bisecting the line distance between the most recently located passing and failing line lengths until a left margin is unambiguously identified.

Although the foregoing invention has been described in some detail for purposes of clarity of understanding, it will be apparent that certain changes and modifications may be practiced within the scope of the appended claims.

What is claimed is:

1. A method of generating buffer data for use in selecting suitable buffer types for placement at given locations in a signal distribution network during the design of a microprocessor, the suitable buffer types being selected to minimize skew in the signal distribution network, the method comprising the following steps:

providing a collection of buffer types available for placement at given locations within a first stage of the signal distribution network;

providing a skew budget for signal propagation between the first stage and a next adjacent stage of said signal distribution network;

for said first stage of the signal distribution network, providing a range of incrementally varying values of at least one feature affecting skew, at least one of said incrementally varying values depending on at least one of said given locations within said first stage; and automatically selecting, for each of said incrementally varying values, one or more suitable buffer types from among the collection of buffer types, which suitable buffer types are selected to meet the skew budget.

2. The method of claim 1, wherein the signal distribution network is a clock distribution network.

3. The method of claim 2, wherein the step of providing a collection of buffer types provides multiple L4 buffers.

4. The method of claim 1, wherein the step of providing a range of incrementally varying values provides incrementally varying values of a line length connecting buffers of said first stage to buffers of said next adjacent stage of the signal distribution network.

5. The method of claim 1, wherein the step of providing a range of incrementally varying values provides incrementally varying numbers of next adjacent stage buffers being driven by a buffer in the first stage.

6. The method of claim 1, wherein the step of automatically selecting one or more suitable buffer types generates a table of suitable buffer types for specified combinations of (i) line length connecting buffers of said first stage to buffers of said next adjacent stage of the signal distribution network, and (ii) numbers of next adjacent stage buffers being driven by a buffer in the first stage.

7. The method of claim 6, wherein the signal distribution network is a clock distribution network and wherein said first stage to buffers are L4 buffers and said next adjacent stage buffers are L5 buffers.

8. The method of claim 6, further comprising a step of determining for a given buffer type whether that buffer meets the skew budget for certain combinations of line length and number of next adjacent stage buffers, which step of determining includes, for a specified number of next adjacent stage buffers, the following steps:

identifying a right margin, said right margin representing a maximum acceptable line length from said first buffer to a specified number of next level buffers, said given buffer type, when connected to a line of the maximum acceptable line length, having a right margin delay of no more than about one or more of (a) a maximum high to low propagation delay from the output of the first buffer to the output of a next level buffer and (b) a maximum low to high propagation delay from the output of the first buffer to the output of a next level buffer; and identifying a left margin, said left margin representing a minimum acceptable line length from said first buffer to a specified number of next level buffers, said given buffer type, when connected to a line of the minimum acceptable line length, having a left margin delay of at least about one or more of (c) a minimum high to low propagation delay from the output of the first buffer to the output of a next level buffer and (d) a minimum low to high propagation delay from the output of the first buffer to the output of a next level buffer.

9. The method of claim 8, wherein at least one of the steps of identifying the right margin and identifying the left margin is performed by a binary search algorithm.

10. The method of claim 8, wherein the steps of identifying the right margin and identifying the left margin further include steps of ensuring that said given buffer type, when connected to a line of the maximum acceptable line length, has no more than a maximum signal rise time and a maximum signal fall time.

11. A system for generating buffer data for use in selecting suitable buffer types for placement at given locations in a signal distribution network during the design of a microprocessor, the suitable buffer types being selected to minimize skew in the signal distribution network, the system comprising:

an input interface for accepting as input parameters (i) a collection of buffer types available for placement at given locations within a first stage of the signal distribution network, (ii) a skew budget for signal propagation between the first stage and a next adjacent stage of said signal distribution network; (iii) a range of incrementally varying values of at least one feature affecting skew, at least one of said incrementally varying values depending on at least one of said given locations within said first stage; and a computational module for automatically selecting, for each of said incrementally varying values, one or more suitable buffer types from among the collection of buffer types, which suitable buffer types are selected to meet the skew budget.

12. The system of claim 11, wherein the signal distribution network is a clock distribution network.

13. The system of claim 12, wherein the input interface accepts L4 buffers as the collection of buffer types.

14. The system of claim 11, wherein the input interface accepts as a range of incrementally varying values incrementally varying values of a line length connecting buffers of said first stage to buffers of said next adjacent stage of the signal distribution network.

15. The system of claim 11, wherein the input interface accepts as a range of incrementally varying values incrementally varying numbers of next adjacent stage buffers being driven by a buffer in the first stage.

16. The system of claim 11, wherein the computational module automatically generates a table of suitable buffer types for specified combinations of (i) line length connecting buffers of said first stage to buffers of said next adjacent stage of the signal distribution network, and (ii) numbers of next adjacent stage buffers being driven by a buffer in the first stage.

17. The system of claim 16, wherein the signal distribution network is a clock distribution network and wherein said first stage to buffers are L4 buffers and said next adjacent stage buffers are L5 buffers.

18. The system of claim 16, wherein the computational module determines for a given buffer type whether that buffer meets the skew budget for certain combinations of line length and number of next adjacent stage buffers, and wherein the computational module determines this for a specified number of next adjacent stage buffers by identifying a right margin, said right margin representing a maximum acceptable line length from said first buffer to a specified number of next level buffers, said given buffer type, when connected to a line of the maximum acceptable line length, having a right margin delay of no more than about one or more of (a) a maximum high to low propagation delay from the output of the first buffer to the output of a next level buffer and (b) a maximum low to high propagation delay from the output of the first buffer to the output of a next level buffer; and identifying a left margin, said left margin representing a minimum acceptable line length from said first buffer to a specified number of next level buffers, said given buffer type, when connected to a line of the minimum acceptable line length, having a left margin delay of at least about one or more of (c) a minimum high to low propagation delay from the output of the first buffer to the output of a next level buffer and (d) a minimum low to high propagation delay from the output of the first buffer to the output of a next level buffer.

19. The system of claim 18, wherein at least one of the right margin and the left margin are identified by the computational module through a binary search algorithm.

20. The system of claim 18, wherein the computational module when identifying the right margin and the left margin ensures that said given buffer type, when connected to a line of the maximum acceptable line length, has no more than a maximum signal rise time and a maximum signal fall time.

21. The system of claim 11, further comprising an output interface which presents a table of suitable buffer types in a format that can be used by a clock buffer insertion tool in the design of an integrated circuit.

22. The system of claim 11, further comprising a display for displaying a layout of said signal distribution network.

23. The system of claim 11, wherein said computational module is provided on a computer having one or more input and output devices, a display device, a data storage device, a central unit, and operational software for controlling said central processing unit.

24. A machine readable medium storing program instructions for generating buffer data for use in selecting suitable buffer types for placement at given locations in a signal distribution network during the design of a microprocessor, the suitable buffer types being selected to minimize skew in the signal distribution network, the machine readable medium comprising instructions for performing the following steps:

providing a collection of buffer types available for placement at given locations within a first stage of the signal distribution network;

providing a skew budget for signal propagation between the first stage and a next adjacent stage of said signal distribution network;

for said first stage of the signal distribution network, providing a range of incrementally varying values of at least one feature affecting skew, at least one of said incrementally varying values depending on at least one of said given locations within said first stage; and automatically selecting, for each of said incrementally varying values, one or more suitable buffer types from among the collection of buffer types, which suitable buffer types are selected to meet the skew budget.

25. The machine readable medium of claim 24, wherein the signal distribution network is a clock distribution network.

26. The machine readable medium of claim 25, wherein the instructions for providing a collection of buffer types provide for accepting multiple L4 buffers.

27. The machine readable medium of claim 24, wherein the instructions for automatically selecting one or more suitable buffer types generates a table of suitable buffer types for specified combinations of (i) line length connecting buffers of said first stage to buffers of said next adjacent stage of the signal distribution network, and (ii) numbers of next adjacent stage buffers being driven by a buffer in the first stage.

28. The machine readable medium of claim 27, further comprising instructions for determining, for a given buffer type, whether that buffer meets the skew budget for certain combinations of line length and number of next adjacent stage buffers, which instructions for determining include, for a specified number of next adjacent stage buffers, instructions for performing the following steps:

identifying a right margin, said right margin representing a maximum acceptable line length from said first buffer to a specified number of next level buffers, said given buffer type, when connected to a line of the maximum acceptable line length, having a right margin delay of no more than about one or more of (a) a maximum high to low propagation delay from the output of the first buffer to the output of a next level buffer and (b) a maximum low to high propagation delay from the output of the first buffer to the output of a next level buffer; and identifying a left margin, said left margin representing a minimum acceptable line length from said first buffer to a specified number of next level buffers, said given buffer type, when connected to a line of the minimum acceptable line length, having a left margin delay of at least about one or more of (c) a minimum high to low propagation delay from the output of the first buffer to the output of a next level buffer and (d) a minimum low to high propagation delay from the output of the first buffer to the output of a next level buffer.

29. The machine readable medium of claim 27, wherein at least one of the steps of identifying the right margin and identifying the left margin is performed by a binary search algorithm.

30. The machine readable medium of claim 27, wherein the steps of identifying the right margin and identifying the left margin are implemented with instructions for performing steps of ensuring that said given buffer type, when connected to a line of the maximum acceptable line length, has no more than a maximum signal rise time and a maximum signal fall time.

* * * * *